(12) United States Patent
Gazeley

(10) Patent No.: US 7,557,419 B2
(45) Date of Patent: Jul. 7, 2009

(54) METHOD AND APPARATUS FOR PREVENTING OR REDUCING COLOR CROSS-TALK BETWEEN ADJACENT PIXELS IN AN IMAGE SENSOR DEVICE

(75) Inventor: William George Gazeley, Corvallis, OR (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 185 days.

(21) Appl. No.: 11/459,135

(22) Filed: Jul. 21, 2006

(65) Prior Publication Data

US 2008/0018662 A1    Jan. 24, 2008

(51) Int. Cl.
*H01L 31/062* (2006.01)
*H01L 31/113* (2006.01)
*H01L 27/14* (2006.01)
*H01L 31/00* (2006.01)
*H01L 31/0232* (2006.01)

(52) U.S. Cl. .......................... 257/435; 257/291; 257/432
(58) Field of Classification Search ......... 257/292–294, 257/431–444, E27.13, E27.132
See application file for complete search history.

(56) References Cited

U.S. PATENT DOCUMENTS

2007/0007559 A1*  1/2007  Lee et al. ..................... 257/292

* cited by examiner

*Primary Examiner*—Cuong Q Nguyen

(57) ABSTRACT

An image sensor device formed in an integrated circuit (IC) with one or more shading structures configured to provide a predetermined shading pattern to control the locations at which light impinges on the photodiode areas of the pixels. The predetermined shading patterns preventing color cross-talk and providing the pixels with substantially symmetric angular responses to light to thereby eliminate or reduce the occurrence of artifacts in the output image produced by the image sensor device.

7 Claims, 4 Drawing Sheets

METHOD AND APPARATUS FOR PREVENTING OR REDUCING COLOR CROSS-TALK BETWEEN ADJACENT PIXELS IN AN IMAGE SENSOR DEVICE

TECHNICAL FIELD OF THE INVENTION

The invention relates to image sensor devices. More particularly, the invention relates to preventing or reducing color cross-talk between adjacent pixels in an image sensor device.

BACKGROUND OF THE INVENTION

An image sensor device is an integrated circuit (IC) having an array of pixels and circuitry for sampling the pixels and processing the pixel sample values. Pixel dimensions in image sensor devices are continually decreasing. At the same time, efforts are continually being made to increase the photodiode area of the pixels. One way to increase photodiode area is to share transistors that perform the same function amongst multiple pixels. Multiplexing devices and techniques are used in image sensor devices to allow these same-function transistors to be shared amongst multiple pixels. This pixel multiplexing makes it possible to increase full-well capacity, fill-factor, and sensitivity of the pixels, and thus to beneficially increase photodiode area. Pixel multiplexing also makes it possible to reduce the number of metal interconnect routes that are needed, which also allows photodiode area to be increased.

In image sensors that use pixel multiplexing, the pixels are spatially arranged in the image sensor such that an intrinsic spatial asymmetry exists between adjacent pixels. An example of a bayer block of a known image sensor device is shown in FIG. 1. A bayer block is a 2-by-2 group of pixels that are covered by green, red, blue, and green color filters (not shown) and together can be used to reassemble the red, green and blue components of the white light illuminating the image sensor device. The bayer block includes a green pixel 2, and red pixel 3, a blue pixel 4, and a green pixel 5. The reset (RST) and source follower (SF) transistors 6 and 7 are shared amongst the pixels 2-5, as is the floating diffusion node 8. Each of the pixels 2, 3, 4, and 5 has a transfer transistor 8, 9, 11, and 12, respectively. Thus, the bayer block shown in FIG. 1 has a total six transistors.

The horizontal routes 14 of the bayer block are formed in the lowest metal layer, the metal-1 layer. The vertical routes 15-18 are formed in the next layer above the metal-1 layer, metal layer 2. The vertical routes 15 and 16 are part of the network of conductors that provide power from the power supply, PVDD, to the pixels 2-5. The vertical route lines 17 and 18 are the even and odd bit columns, respectively. Multiplexing circuitry (not shown) is used to select (i.e., turn on) only one the transfer transistors 8, 9, 11 and 12 at any given time to sample the selected pixel.

While the pixels 2-5 have very good symmetry with regard to mirroring about a horizontal or vertical axis, the overlaying color filters follow translational symmetry, which produces an asymmetrical optical angular response for the combined structure of the bayer block. This asymmetrical optical angular response often results in color cross-talk between adjacent pixels, i.e., light of one color bleeding over into a pixel intended to receive light of a different color. This color cross-talk is problematic because it can lead to artifacts in the final output image produced by the image sensor device.

The manner in which color cross-talk occurs in the image sensor device shown in FIG. 1 can be in seen in FIG. 2. FIG. 2 illustrates a cross-sectional view of a portion of an image sensor device comprising two adjacent pixels 3 and 23, a color filter device 37 and a microlens structure 38. The pixel 3 on the left corresponds to the red pixel 3 shown in FIG. 1. The pixel 23 on the right of pixel 3 is an adjacent green pixel, which cannot be seen in FIG. 1. In the red pixel 3, the bottom layer 21 is the substrate, which is typically polysilicon, and the layer 22 above it is the photodiode layer that contains the photosensitive area 35 of the photodiode. The blocks 8 and 9 correspond to transfer transistors 8 and 9, respectively, shown in FIG. 1. Transfer transistor 9 is part of pixel 3, whereas transfer gate 8 is part of the green pixel 2 shown in FIG. 1, which is not shown in FIG. 2. The blocks 16, 17 and 18 correspond to vertical routes 16, 17 and 18, respectively, shown in FIG. 1, which are formed in the metal-2 layer. In the green pixel 23, the bottom layer 31 is the polysilicon substrate, and the layer 32 above it contains the photosensitive area 36 is the photodiode itself. The blocks 24 and 25 are transfer transistors. The transfer transistor 24 is part of the green pixel 23, whereas the transfer transistor 25 is part of the red pixel (not shown) to the right of green pixel 23. The blocks 26 and 27 are vertical routes formed in the metal-2 layer. Of course, layers 21 and 22 and layers 31 and 32 correspond, respectively, to the same layers.

The color filter device 37 and the microlens structure 38 are spatially arranged such light is received by them at angles that are non-normal with respect to the plane of the color filter device 37. The spatial arrangement is intended to match the principle ray bundle angle resulting from the off-axis locations of the pixels. The principle ray bundle is represented by arrows 41. Each ray bundle is represented by a red component 41A, a green component 41B and a blue component 41C, which together form white light. The portion of the color filter device 37 shown in FIG. 3 includes a red color filter 43 and a green color filter 44. The red color filter 43 passes only the red component 41A and filters out the green and blue components 41B and 41C. The green color filter 44 passes only the green component 41B and filters out the red and blue components 41A and 41C.

The color filter device 37 and microlens structure 38 are spatially arranged as shown to ensure that the red component 41A is only incident on the photosensitive area 35 of the red pixel 3 and the green component 41B is only incident of the photosensitive area 36 of the green pixel 23. However, because of the spatial asymmetry of the adjacent pixels 3 and 23, and the angle of the light, some of the red components 41A may be incident on, or bleed into, the photosensitive area 36 of the green pixel 23, thereby resulting in color cross-talk. The optical asymmetry of adjacent pixels that results from the spatial asymmetry of the pixels is often phrased as the pixel having an asymmetrical angular response. It is also possible, but less likely because of the angle of the light, that green components 41B will be incident on the photosensitive area 35 of the red pixel 3. The situation is reversed on the opposite edge of the imaging array, where it is more likely that some green components will bleed onto the photosensitive area of the red pixel than it is that some red components will bleed onto the photosensitive area of the green pixel.

Color cross-talk between adjacent pixels can produce artifacts in the output image of the imaging device in the form of color variations across the imaging array of pixels where there should be color uniformity. For example, when imaging a target of uniform color (in particular, of uniform hue), the asymmetrical angular responses of the pixels may result in the output image having a displeasing greenish hue on one edge of the image and purple-ish hue on the other edge of the image. Furthermore, the asymmetrical angular response of pixels is even more pronounced in pixels located farther away from optical center of the imaging array, which can result in cross-talk amongst pixels closer to the optical center being unequal to cross-talk amongst pixels farther from the optical center. This unequal cross-talk typically results in more pronounced hue artifacts in the image.

Accordingly, a need exists for a way to eliminate or reduce color cross-talk between adjacent pixels in image sensor devices.

SUMMARY OF THE INVENTION

The invention provides an image sensor device formed in an integrated circuit (IC) and comprising a plurality of pixels, each of which has a photodiode area, and one or more shading structures configured to provide a predetermined shading pattern to control locations at which light impinges on the photodiode areas of the pixels. The predetermined shading patterns provide the pixels with substantially symmetrical angular responses to light and eliminate or reduce the occurrence of artifacts in the output image produced by the image sensor device.

The method comprises designing an IC to include one or more shading structures, and fabricating an IC based on the design to produce an IC having said one or more shading patterns. Each shading structure provides a predetermining shading pattern to thereby control the locations at which light impinges on photodiode areas of the pixels. The predetermined shading patterns provide the pixels with substantially symmetrical angular responses to light, thereby preventing or reducing the occurrence of artifacts in the output image produced by the image sensor device.

These and other features and advantages of the invention will become apparent from the following description, drawings and claims.

DETAILED DESCRIPTION OF THE INVENTION

In accordance with the invention, one or more shading structures are used in the image sensor device to compensate for the non-normal angle of the incident light ray bundle, thereby making the angular response of the pixels more symmetrical. By making the angular response of the pixels more symmetrical, color cross-talk between adjacent pixels can be eliminated, or at least reduced. Making the angular responses of the pixels more symmetrical also eliminates or reduces the possibility of artifacts occurring in the output image of the image sensor device.

The structures that are used to make the angular response of the pixels more symmetrical include, for example, shading structures that are introduced into, or already existing in, the image sensor device that provide shading of light to control the locations at which light impinges on the photodiode area. The shading structures may have any number of shapes, including, but not limited to, slabs, stubs, square rings, circular rings, oval rings, elliptical rings, etc., and may be in any layer of the image sensor device or in any layer available in the fabrication process. In addition, the locations of the shading structures may vary depending on whether pixels that are being shadowed are located nearer to or farther away from the optical center of the imaging array.

Figure 1:
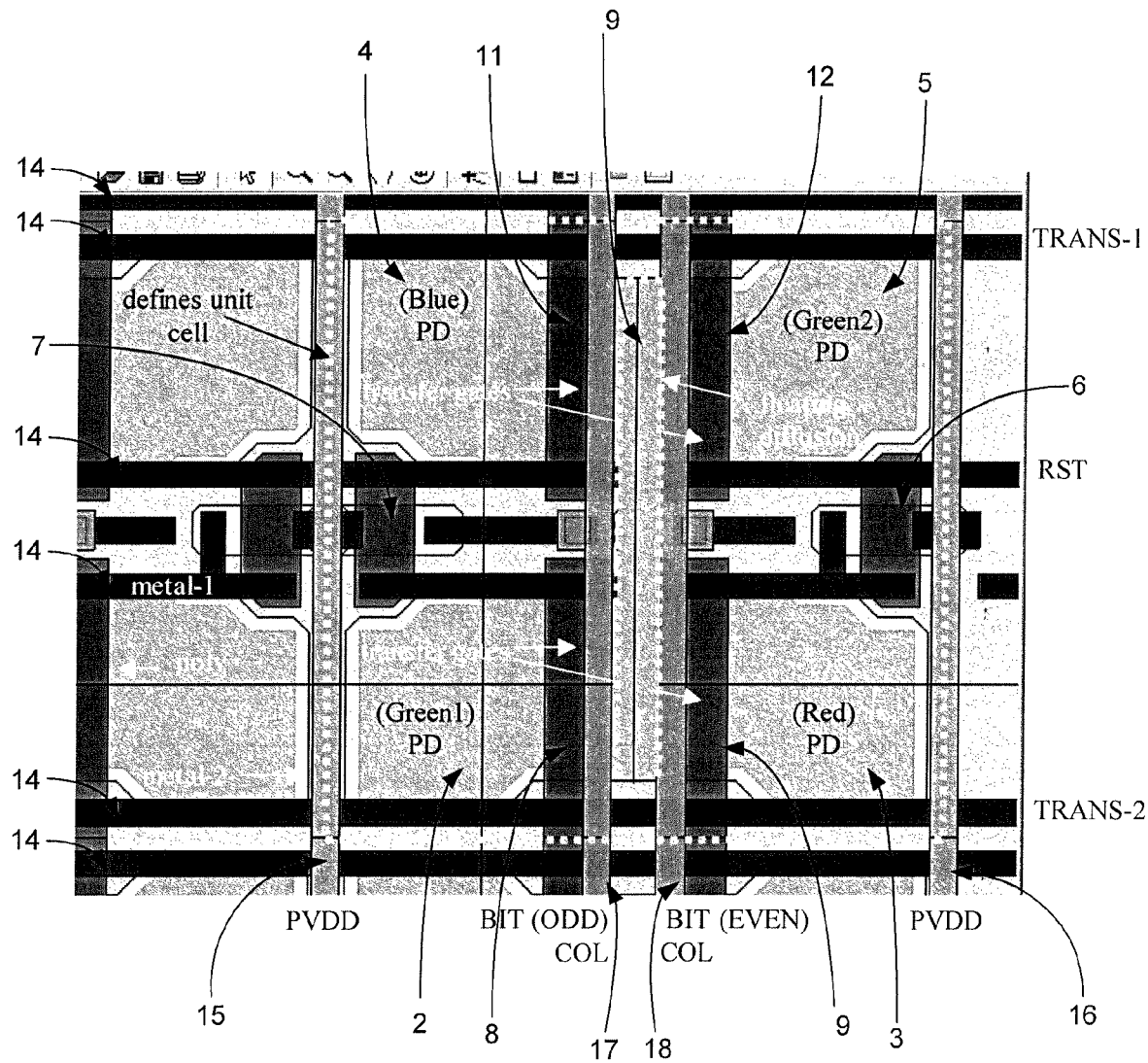
FIG. 1 illustrates a plan view of a bayer block of a known image sensor device.
Figure 2:
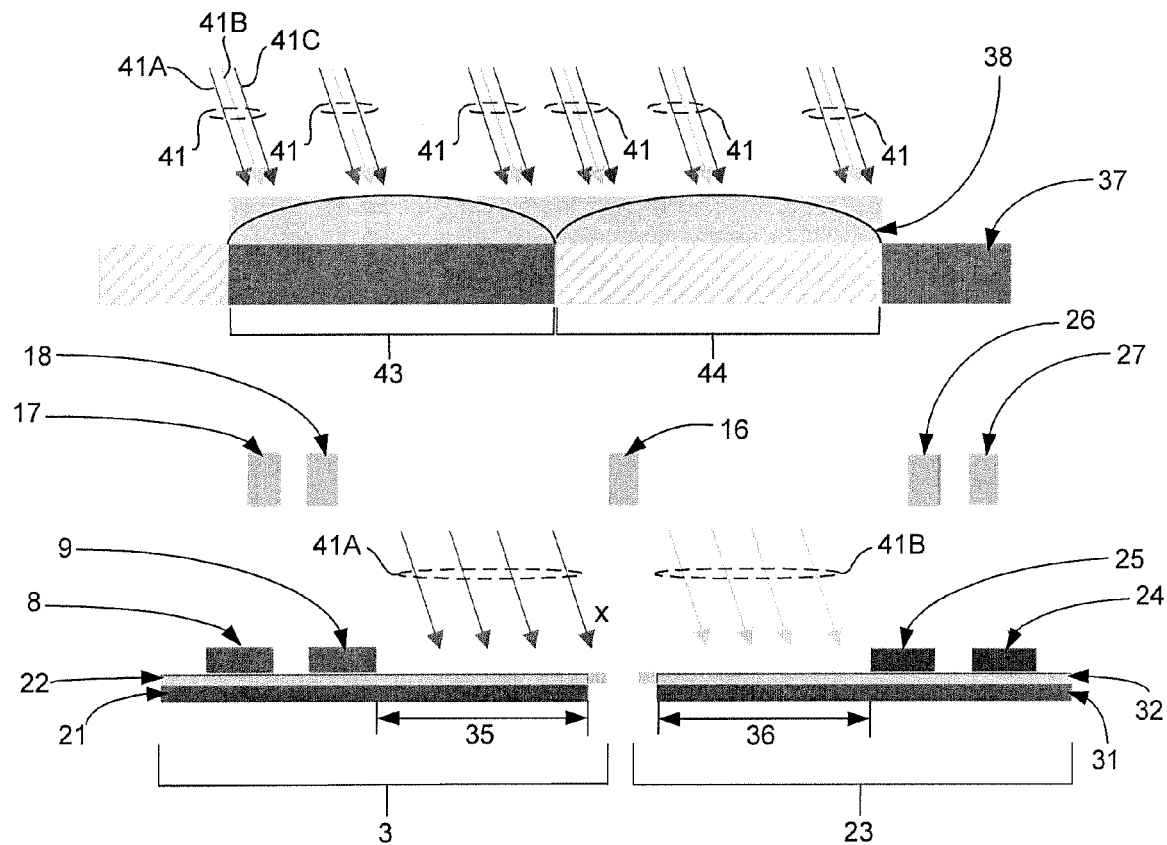
FIG. 2 illustrates a cross-sectional view of a portion of a known image sensor device comprising two adjacent pixels, a color filter device and a microlens structure.
Figure 3:
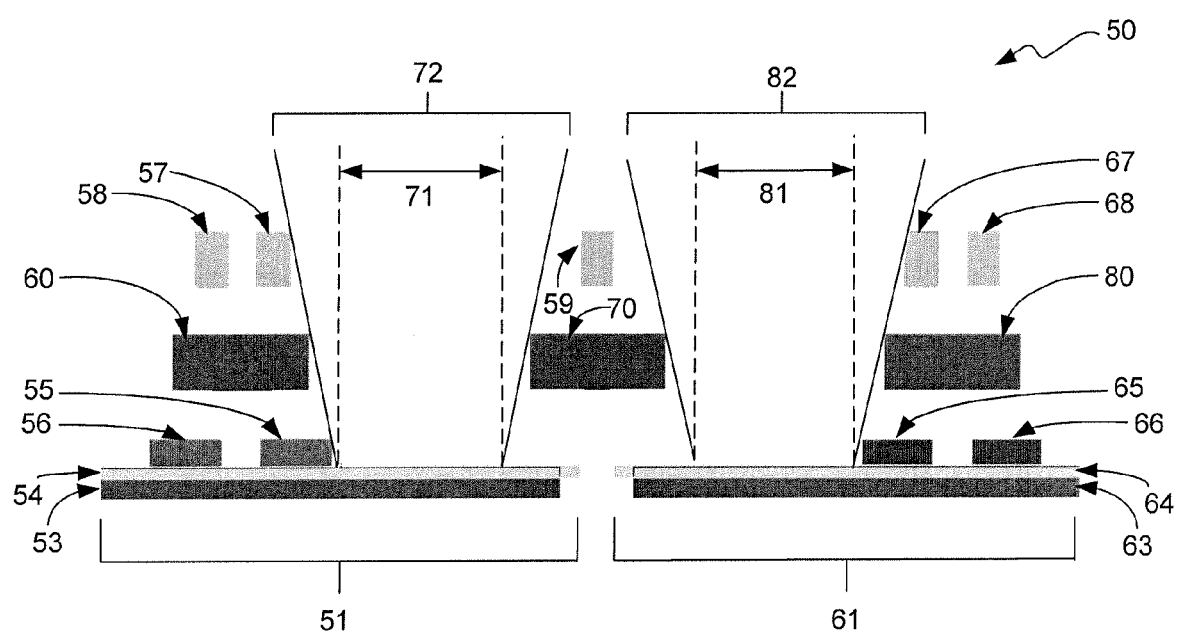
FIG. 3 illustrates a cross-sectional view of a portion of an image sensor device of the invention in accordance with an exemplary embodiment showing two adjacent pixels.

FIG. 3 illustrates a cross-sectional view of a portion of an image sensor device 50 showing two adjacent pixels 51 and 61. For exemplary purposes, it will be assumed that the structure of the image sensor device 50 is identical to the portion of the image sensor device shown in FIG. 2, and uses shared transistors and pixel multiplexing. It should be understood, however, that the invention is not limited to any particular type of image sensor device, but applies equally to any types of image sensor devices in which it is desirable to prevent color cross-talk. The invention also is not limited with respect to the type of process that is used to create the image sensor device. The invention is particularly well suited for use in image sensor devices having imaging arrays in which adjacent pixels are intended to respond to light of different colors. Such image sensor devices typically include color filters and microlens devices such as those shown in FIG. 2, although this is not a requirement of the invention.

With reference again to FIG. 3, pixel 51 has a substrate layer 53, a photodiode layer 54, and a transfer transistor 55. The transfer transistor 56 is part of an adjacent pixel (not shown) to the left of pixel 51. Vertical routes 57-59 are formed in the metal-2 layer of the image sensor device. Pixel 61 has a substrate layer 63, a photodiode layer 54, and a transfer transistor 65. The transfer transistor 66 is part of an adjacent pixel (not shown) to the right of pixel 61. Vertical routes 67 and 68 are formed in the metal-2 layer of the image sensor device.

As stated above, in accordance with the invention, one or more shading structures are included in the image sensor device to provide primary shading of light onto the photosensitive areas 71 and 81 of the pixels 51 and 61, respectively. In accordance with this exemplary embodiment, shading structures 60, 70 and 80 are included in the image sensor device 50. The bracket 72 is used to indicate the beam of light that is partially blocked by shading structures 60 and 70 to ensure that the light impinges on photodiode area 71 of pixel 51, but does not impinge on photodiode are 81 of pixel 61. Likewise, shading structures 70 and 80 partially block light beam 82 to ensure that the light impinges on photodiode area 81 of pixel 61, but does not impinge on photodiode are 71 of pixel 51. Thus, color cross-talk is prevented or at least significantly reduced. In addition, the shading structures 60, 70 and 80 ensure that the pixels 51 and 61 will have symmetrical angular responses to light, which prevents artifacts from occurring in the final output image.

In the exemplary embodiment represented by FIG. 3, the shading structures 60, 70 and 80 are formed by extending metal-2 layer. The structures could instead have been formed in a different metal layer, such as the metal-3 layer, for example. As stated above, the invention is not limited to where in the image sensor device the shading structures are formed, or with respect to the materials that are used to create the shading structures.

Figure 4:
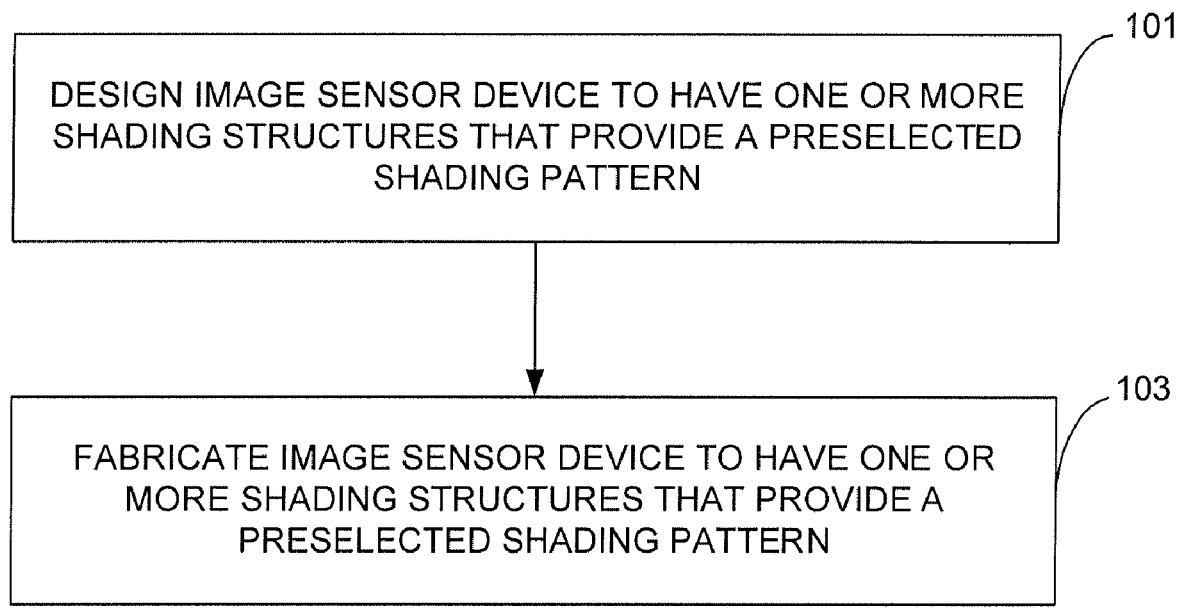
FIG. 4 illustrates a flowchart that represents the method of the invention in accordance with an exemplary embodiment.

FIG. 4 illustrates a flowchart that represents the method of the invention in accordance with an exemplary embodiment for putting the shading structures in the image sensor device. The shading structures preferably are put in the image sensor device at the wafer level of the fabrication process that is used to create the image sensor ICs. Thus, the shading structures have been designed prior to fabrication to achieve the best possible results (i.e., to control locations of impingement of light and provide pixels with symmetrical angular responses) taking into account other IC design considerations. Therefore, the first step in the process is to design an image sensor device to include one or more shading structures that are configured to control the locations at which light impinges on the photodiode areas of the pixels. This step is represented by block 101. After the image sensor device has been designed to include one or more shading structures, the image sensor device having one or more shading structures is fabricated, as indicated by block 103.

It should be noted that the invention has been described with reference to particular embodiments for the purpose of demonstrating the principles and concepts of the invention. The invention, however, is not limited to these embodiments. Those skilled in the art will understand, in view of the description provided herein, the manner in which modifications can be made to the embodiments described herein, and the manner in which the principles and concepts of the invention can be extended to cover other embodiments. All such modifications and extensions are within the scope of the invention.

What is claimed is:

1. An image sensor device formed in an integrated circuit (IC), the image sensor device comprising:
    a plurality of pixels, each pixel having a photodiode area; and
    one or more shading structures configured to provide a predetermined shading pattern to control locations at which light impinges on the photodiode areas of the pixels, the predetermined shading patterns providing the pixels with substantially symmetrical angular responses to light, wherein a layout of the pixels is such that a spatial arrangement of adjacent pixels is asymmetrical.

2. The image sensor device of claim 1, wherein said one or more shading structures are formed in one or more metal layers of the IC.

3. The image sensor 2, wherein said one or more shading structures are formed in one or more metal interconnects of the IC.

4. The image sensor device of claim 1, wherein the shading pattern is such that color cross-talk between adjacent pixels is reduced or eliminated.

5. The image sensor device of claim 1, wherein said one or more shading structures correspond to one or more slabs.

6. The image sensor device of claim 1, wherein said one or more shading structures correspond to one or more stubs.

7. The image sensor device of claim 1, wherein said one or more shading structures correspond to one or more square, circular, oval, or elliptical rings.

* * * * *